United States Patent
Xiao et al.

(10) Patent No.: US 11,899,505 B2
(45) Date of Patent: Feb. 13, 2024

(54) HINGE AND HINGE DEVICE FOR A MOBILE TERMINAL HAVING EXTERNAL FLEXIBLE SCREEN

(71) Applicant: Hangzhou Amphenol Phoenix Telecom Parts Co., Ltd., Zhejiang (CN)

(72) Inventors: Yang Xiao, Zhejiang (CN); Mengyu Si, Zhejiang (CN); Guanlun Cheng, Zhejiang (CN)

(73) Assignee: HANGZHOU AMPHENOL PHOENIX TELECOM PARTS CO., LTD., Zhejiang (CN)

( * ) Notice: Subject to any disclaimer, the term of this patent is extended or adjusted under 35 U.S.C. 154(b) by 782 days.

(21) Appl. No.: 16/962,170

(22) PCT Filed: Jan. 15, 2019

(86) PCT No.: PCT/CN2019/071765
§ 371 (c)(1),
(2) Date: Jul. 14, 2020

(87) PCT Pub. No.: WO2019/141163
PCT Pub. Date: Jul. 25, 2019

(65) Prior Publication Data
US 2021/0064098 A1 Mar. 4, 2021

(30) Foreign Application Priority Data
Jan. 16, 2018 (CN) .......................... 201820073596.1

(51) Int. Cl.
*E05D 11/00* (2006.01)
*G06F 1/16* (2006.01)
(Continued)

(52) U.S. Cl.
CPC ............ *G06F 1/1681* (2013.01); *F16C 11/04* (2013.01); *G06F 1/1652* (2013.01); *H04B 1/3827* (2013.01); *H10K 77/111* (2023.02)

(58) Field of Classification Search
CPC .. E05D 3/12; E05D 3/18; E05D 3/122; E05D 3/06; E05D 3/10; E05D 7/0045;
(Continued)

(56) References Cited

U.S. PATENT DOCUMENTS 10,686,028 B2 * 6/2020 Ahn ...................... G06F 1/1652
11,073,868 B2 * 7/2021 Lin ....................... G06F 1/1616
(Continued)

FOREIGN PATENT DOCUMENTS

| CN | 204069046 U | 12/2014 |
|---|---|---|
| CN | 205657718 U | 10/2016 |

(Continued)

OTHER PUBLICATIONS

Search Report issued in corresponding International application No. PCT/CN2019/071765 (with English translation) dated Apr. 10, 2019.
(Continued)

*Primary Examiner* — Chuck Y Mah
(74) *Attorney, Agent, or Firm* — MUNCY, GEISSLER, OLDS & LOWE, P.C.

(57) ABSTRACT

A hinge of a mobile terminal having an external flexible screen includes a main support, a first support plate and a second support plate. Auxiliary supports are arranged between the first support and the main support, and between the second support and the main support. The main support and the auxiliary supports correspond to the bending portion when the hinge is folded. The hinge includes a plastic sheet to be repeatedly bent back and forth. The plastic sheet is located on the upper surface near the end of the auxiliary supports and the main support, and fixedly connected with the auxiliary support and the main support. The two ends of the plastic sheet are respectively connected with the first support and the second support. The structure of the hinge is reasonable, to make the structure in the middle of the hinge easier to assemble and has longer service life.

10 Claims, 5 Drawing Sheets

(51) Int. Cl.
*F16C 11/04* (2006.01)
*H04B 1/3827* (2015.01)
*H10K 77/10* (2023.01)

(58) Field of Classification Search
CPC .............. E05D 11/082; E05D 11/087; E05D 2011/085; E05D 2007/0072; G06F 1/1681; G06F 1/1616; G06F 1/1618; G06F 1/1652; G06F 1/168; E05Y 2900/606; E05Y 2900/602; H04M 1/0216; H04M 1/0222; H04M 1/022; H05K 5/0226; H10K 77/111; H04B 1/3827

See application file for complete search history.

(56) References Cited

U.S. PATENT DOCUMENTS

| | | | | |
|---|---|---|---|---|
| 11,474,567 | B2* | 10/2022 | Chen | E05D 3/122 |
| 2014/0196254 | A1* | 7/2014 | Song | E05D 3/16 |
| | | | | 16/302 |
| 2015/0077917 | A1* | 3/2015 | Song | G06F 1/1652 |
| | | | | 361/679.27 |
| 2016/0085271 | A1* | 3/2016 | Morrison | G06F 1/1641 |
| | | | | 361/679.27 |
| 2016/0139634 | A1* | 5/2016 | Cho | G06F 1/1652 |
| | | | | 16/366 |
| 2018/0110139 | A1* | 4/2018 | Seo | G06F 1/1681 |
| 2018/0317333 | A1* | 11/2018 | Bi | H05K 5/0017 |
| 2018/0329460 | A1* | 11/2018 | Song | G06F 1/1626 |
| 2019/0245955 | A1* | 8/2019 | Lee | H04M 1/0268 |
| 2020/0097051 | A1* | 3/2020 | Liu | G06F 1/1652 |

FOREIGN PATENT DOCUMENTS

| | | |
|---|---|---|
| CN | 205847346 U | 12/2016 |
| CN | 206100081 U | 4/2017 |
| CN | 206377137 U | 8/2017 |
| CN | 207975120 U | 10/2018 |
| KR | 20170087008 A | 7/2017 |

OTHER PUBLICATIONS

Written Opinion issued in corresponding International application No. PCT/CN2019/071765 (with English translation) dated Apr. 10, 2019.

* cited by examiner

Fig. 8

HINGE AND HINGE DEVICE FOR A MOBILE TERMINAL HAVING EXTERNAL FLEXIBLE SCREEN

TECHNICAL FIELD

The present invention relates to a mobile terminal having a flexible screen and its hinge.

BACKGROUND

Flexible screen is an emerging screen. For a mobile terminal having an external flexible screen whose flexible screen is arranged outside the mobile terminal, it is necessary to deal with the change in length caused by closing and opening of the hinge. For the middle of the hinge, some hinges use a structure of multiple supports to achieve the support and shape change when bending and flattening. However, the ease of assembly and service life of this portion need to be improved.

SUMMARY

The first technical problem to be solved by the present invention is to provide a hinge of a mobile terminal having an external flexible screen, which can be applied to a mobile terminal having a flexible screen, and makes the middle of the hinge easier to assemble and have a longer service life. To this end, the present invention adopts the following technical solutions:

A hinge of a mobile terminal having an external flexible screen, and its outside provides support for the flexible screen, wherein it includes a main support, which is provided with a first shaft and a second shaft, and the hinge is provided with a first support frame and a second support frame which are respectively connected with the first shaft and the second shaft, and a first support and a second support which are respectively slidably connected with the first support frame and the second support frame; an auxiliary support is provided between the first support and the main support, and between the second support and the main support, and the main support and the auxiliary support correspond to the bending portion when the hinge is folded;

The hinge is also provided with a plastic sheet that can be repeatedly bent back and forth; the plastic sheet is located on the upper surface near the ends of the auxiliary support and the main support, and two ends of the plastic sheet are respectively connected with the first support and the second support, and the plastic sheet is also fixedly connected with the auxiliary support and the main support.

Further, the first support plate and the second support plate are respectively provided with a connector, and the plastic sheet is inlaid with the connector on the first support plate and the connector on the second support plate for injection molding.

Further, the plastic sheet is fused with the auxiliary support and the main support.

Further, the plastic sheet is snap-fitted to the auxiliary support and the main support.

Further, the plastic sheet is integrated with the auxiliary support by injection molding.

Further, the plastic sheet has concave portions recessed inside the plastic sheet body between the corresponding adjacent auxiliary supports, and between the main support and the adjacent auxiliary support, and the bottom of the concave portion is circular; the portion connected with the auxiliary support has a corner portion and/or an insertion portion on both sides, and the portion connected with the main support has a portion inserted into the main support which has corresponding holes; the portion that are connected with the connector has a clamping column embedded in the connector.

Further, the connector on the first support, the connector on the second support, the plastic sheet, the main support and the auxiliary supports are combined into an assembled unit module, and the connector on the first support plate and the connector on the second support are respectively connected with the first support and the second support.

Further, the hinge is also provided with a first guide structure which revolves together with the first support frame around the hinge shaft and a second guide structure which revolves together with the second support frame around the hinge shaft; the auxiliary support between the first support and the main support has a structure which cooperates with the first guide structure for guiding, and the auxiliary support between the second support and the main support has a structure which cooperates with the second guide structure for guiding; the auxiliary support between the first support and the main support can rotate, and revolve with the first support around the hinge shaft, and the auxiliary support body between the second support and the main support can rotate, and revolve with the second support around the hinge shaft; the axes of rotation and the hinge shafts are parallel, and the center of the rotation is at or near the support reference plane of the flexible screen;

The hinge is also provided with a synchronous control mechanism for making the first support and the second support plate revolve synchronously around the hinge shafts as the axes.

Further, the first guide structure and the second guide structure are both guide grooves; the auxiliary support between the first support and the main support has a guide pin which is cooperated with the first guide structure, and the auxiliary support between the second support and the main support has a guide pin which is cooperated with the first guide structure, so that when the auxiliary support between the first support and the main support and the auxiliary support between the second support and the main support are multiple, the multiple auxiliary supports between the first support plate and the main support and the multiple auxiliary supports between the second support and the main support rotate in order.

Another object of the invention is to provide a hinge device of a mobile terminal having an external flexible screen, which includes two of the above-mentioned hinges, and the axes of the hinge shafts of the two hinges are one-to-one coincident; the first support of the two hinges can be integrated, as well as the second support of the two hinges, and the main support of the two hinges; the number of the auxiliary supports between the first support of the two hinges and the main support is equal and the auxiliary supports are one-to-one connected as a whole; the number of the auxiliary supports between the second support of the two hinges and the main support is equal and the auxiliary supports are one-to-one connected as a whole.

As a result of adopting the technical solution of the present invention, the structure of the invention is reasonable, and the structure in the middle of the hinge can be more easily assembled and the service life is longer. When the invention is applied to mobile terminals such as mobile phones, e-books, laptops, etc., it can be used not only as the hinge, but also as a flexible screen supporting structure that provides support for the flexible screen on the outside of the hinge; when the mobile phone and the laptop are opened and folded, the flexible screen can be unfolded and folded freely, so that the flexible screens can realize large-screen display in a small volume, and the mobile terminal has a perfect and harmonious appearance shape when opened and folded.

DETAILED DESCRIPTION

Refer to the attached drawings. A hinge of a mobile terminal having an external flexible screen provided by the invention, the outer side of which provides support for the flexible screen. The hinge comprises a main support 1, which is provided with a hinge shaft, and as a dual-shaft hinge, the main support 1 is provided with two parallel hinge shafts, namely the first shaft 11 and the second shaft 12.

The hinge is provided with a first support frame 21 and a second support frame 22, which the first support 31 and the second support 32 are slidably connected with the first support frame 21 and the second support frame 22, respectively, and the first support frame 21 and the first shaft 11 are rotatably connected, as well as the second support frame 22 and the second shaft 12. The first support frame 21 and the second support frame 22 are respectively provided with guide grooves 211 and 221, and the first support 31 and the second support 32 are respectively connected with sliders 311 and 321 slide that rotatably connected with guide grooves 211 and 221.

The sliders 311 and 321 are respectively provided with grooves 312 and 322, and the first support frame 21 and the second support frame 22 are provided with snap rings 212 and 222, the snap rings 212 and 222 are provided with convex portions 213 and 223 which are cooperated with the grooves 312 and 322, which the grooves and the convex portions are cooperated to provide the hand feeling when the hinge is opened and folded in place.

The plastic sheet 700 is integrally hot-melt connected with the auxiliary supports 41, 42, 43, 44 and the main support 1.

The plastic sheet 700 can also be snap-fitted with the auxiliary support and the main support. Or, on the basis of snap-fit connection, it is also hot-melt connected.

The plastic sheet 700 has concave portions 701 recessed on a surface of a plastic sheet body between the corresponding adjacent auxiliary supports, and between the main support and the adjacent auxiliary support, and the bottom of the concave portion is circular; the portions connected with the auxiliary support has a corner portion 702 and/or a insertion portion 705 on both sides, and the portion connected with the main support 1 has a portion 703 inserted into the main support 1, which has corresponding holes; the portions connected with the first support 31 and the second support 32 have clamping columns 704 embedded in the first support plate 31 and the second support plate 32 (or the connector 313 on the first support and the connector 323 on the second support), which allows better flexibility and connection performance.

Figure 1:
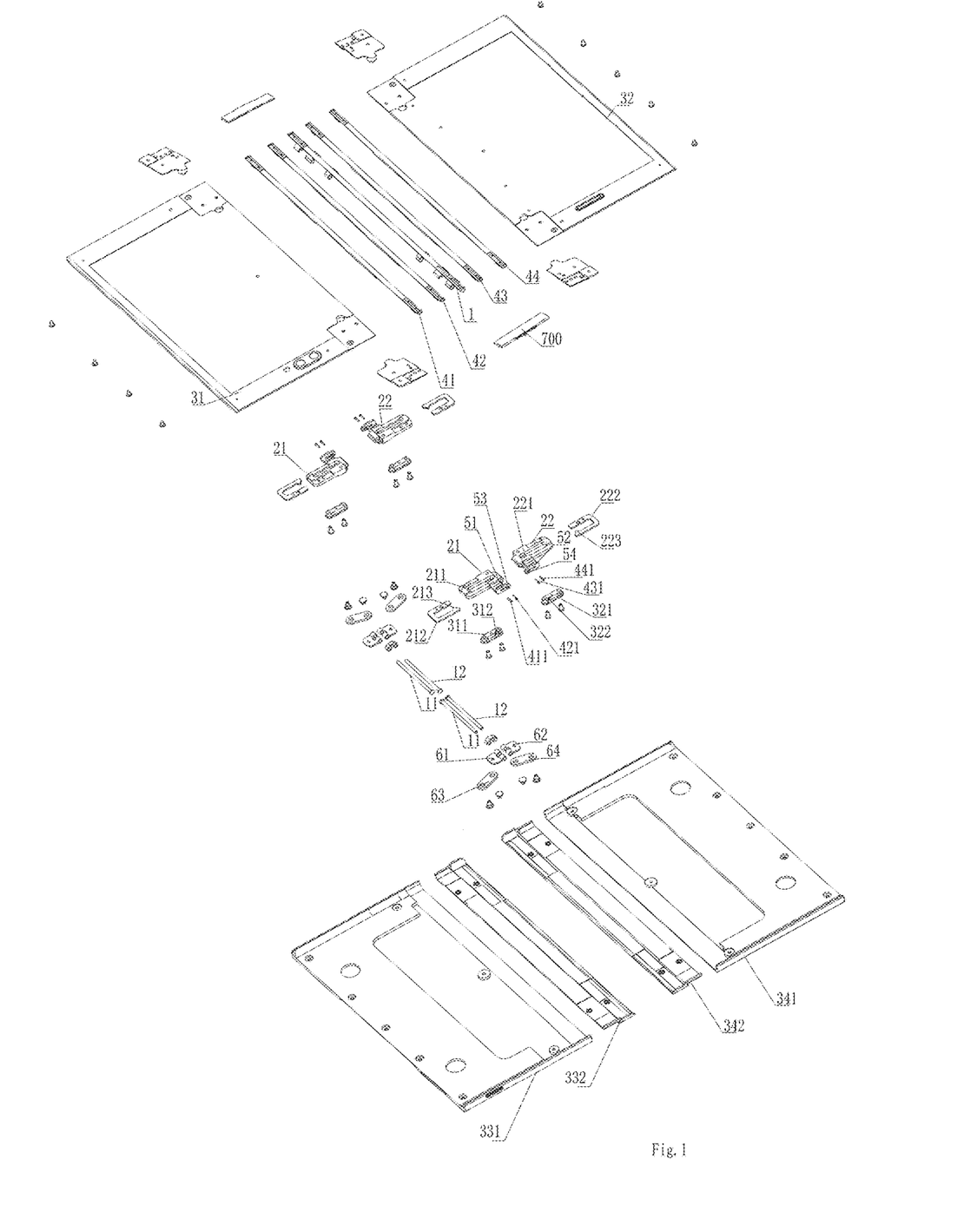
FIG. 1 is an exploded view of the embodiment provided by the invention.
Figure 2:
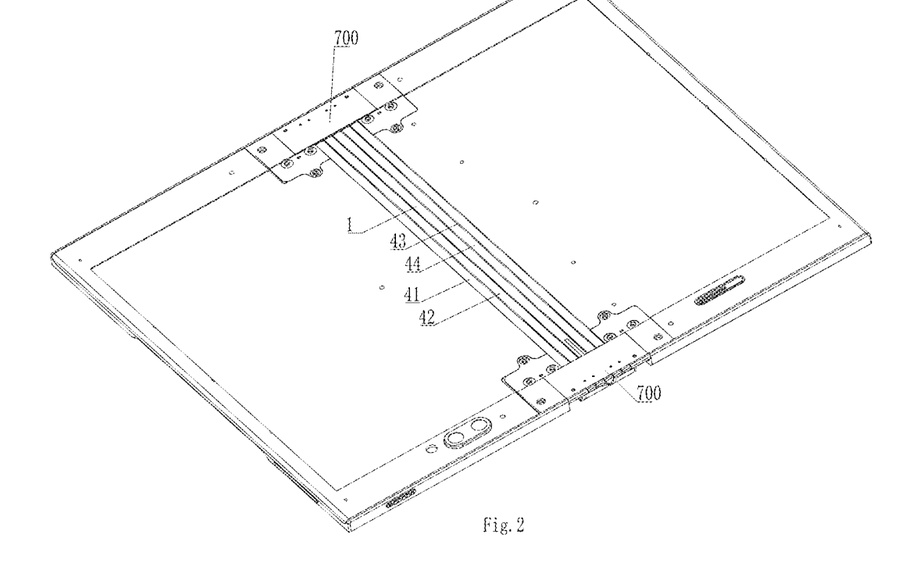
FIG. 2 is a schematic diagram of the outside of the hinge device in the open state of the embodiment provided by the invention.
Figure 3:
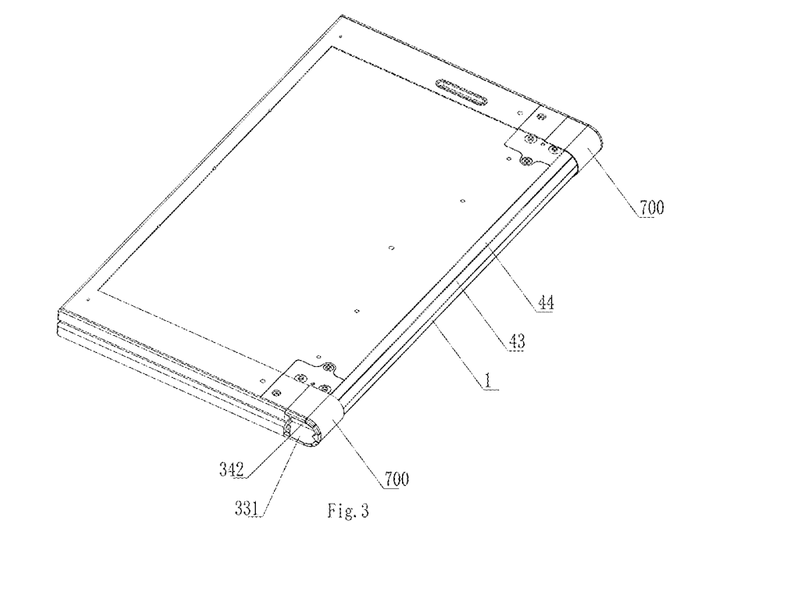
FIG. 3 is a schematic diagram of a hinge device in a folded state of the embodiment provided by the invention.
Figure 4:
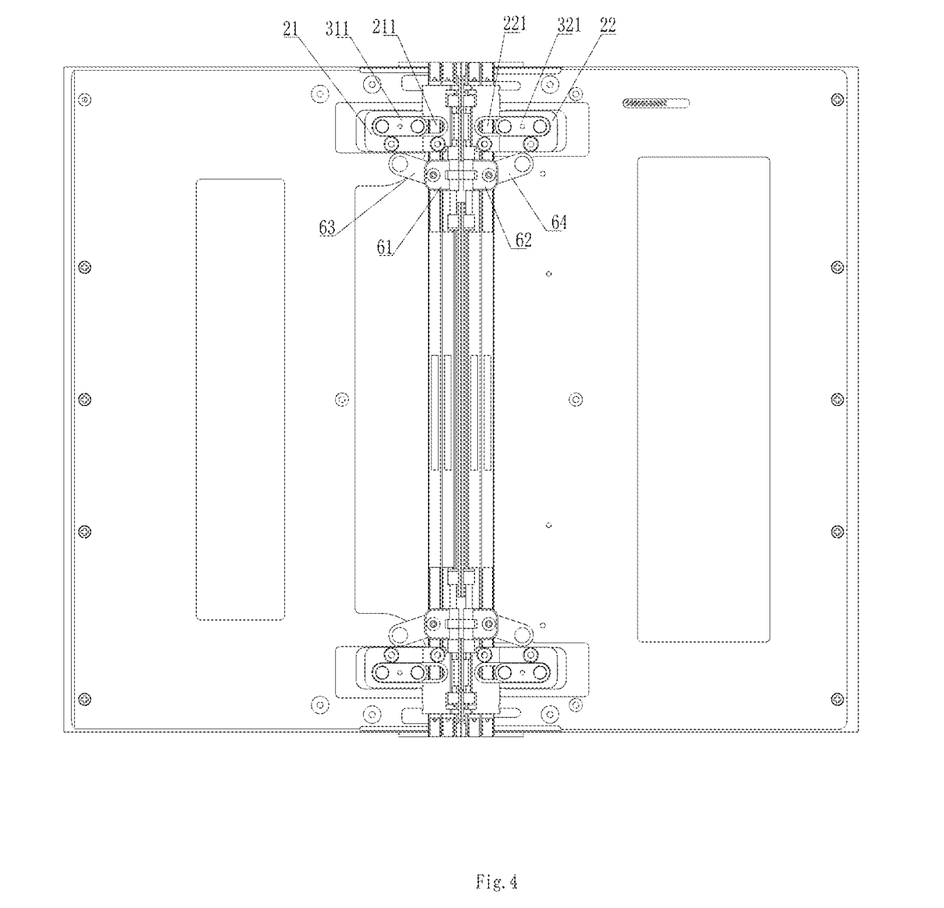
FIG. 4 is a structural diagram of the embodiment provided by the invention in the open state.
Figure 5:
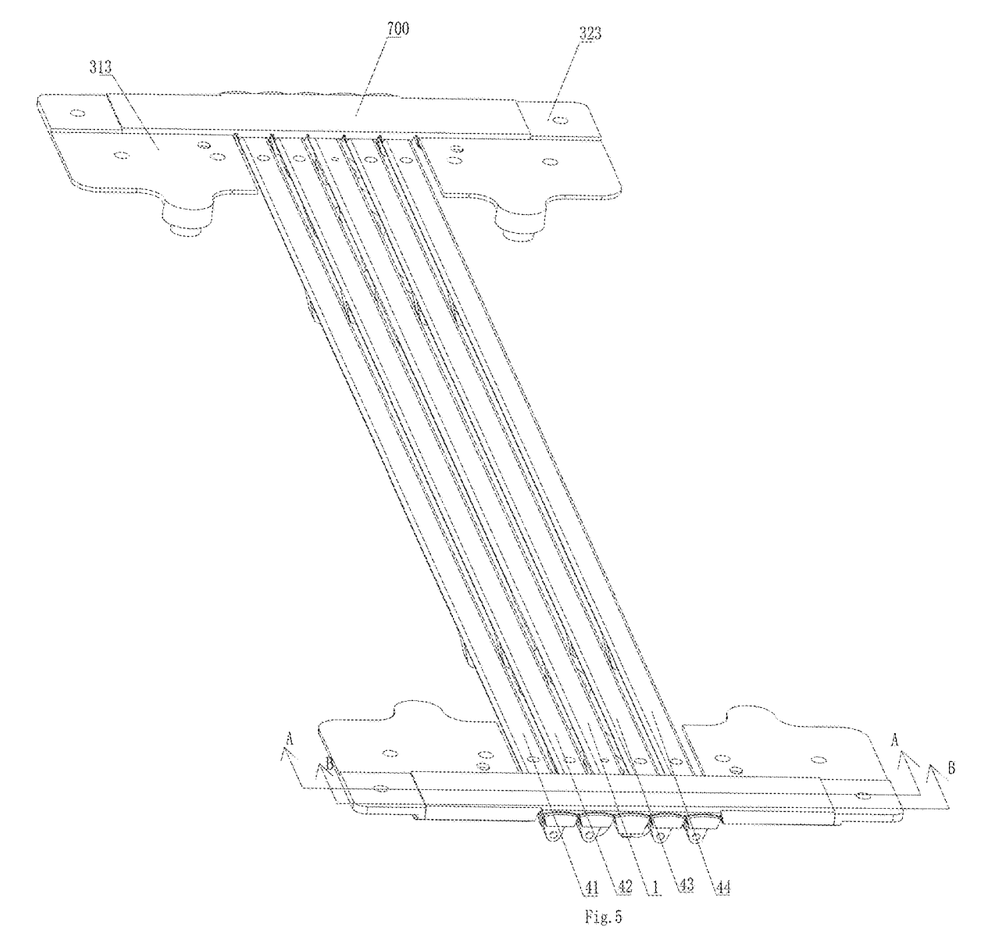
FIG. 5 is a schematic diagram of a module of the main support, the auxiliary support, the connector and the plastic sheet of the embodiment provided by the invention.
Figure 6:
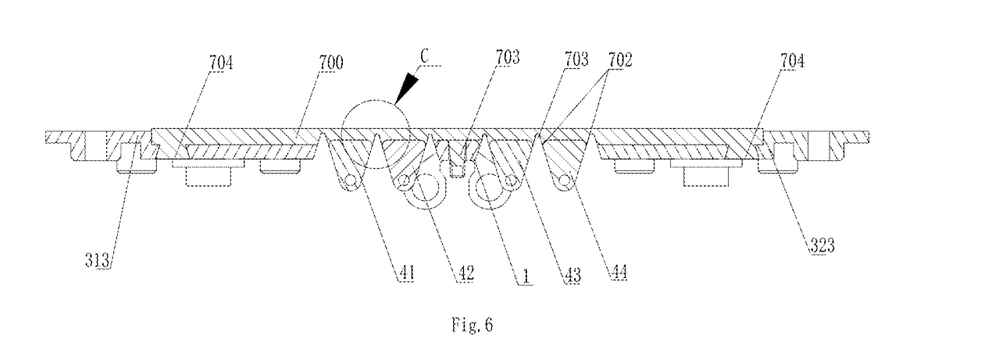
FIG. 6 is a cross-sectional view taken along line A-A in FIG. 5.
Figure 7:
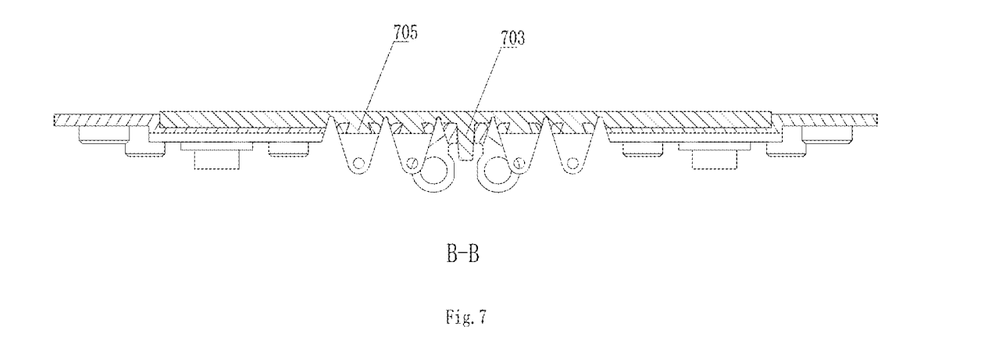
FIG. 7 is a cross-sectional view taken along line B-B in FIG. 5.
Figure 8:
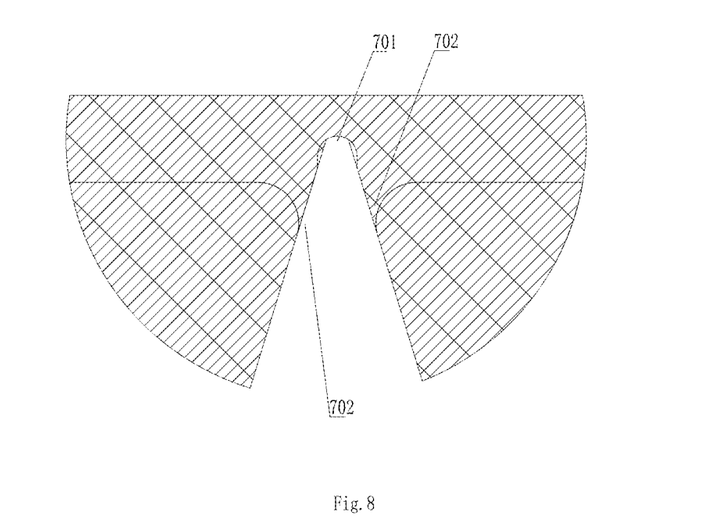
FIG. 8 is an enlarged view of part C in FIG. 6.

As shown in FIG. 6, in this way, the connector 313 on the first support plate, the connector 323 on the second support plate, the plastic sheet 700, the main support 1, and the auxiliary supports 41, 42, 43 and 44 are combined into an assembled unit module, and the connector 313 on the first support plate and the connector 323 on the second support plate are respectively connected with the first support 31 and the second support 32, which makes the installation more convenient.

The auxiliary supports 41 and 42 between the first support 31 and the main support 1 can rotate, and revolve together with the first support frame 21 around the hinge shaft 11, and the auxiliary supports 43 and 44 between the second support 32 and the main support 1 can rotate, and revolve with the second support frame 22 around the hinge shaft 12; the axes of rotation and the hinge shafts 11 and 12 are parallel, and the rotation center is at or near the support reference plane of the flexible screen. When the hinge is applied to the mobile terminal, the support reference plane of the flexible screen is the layer with constant length in the process of opening and closing the mobile terminal, which is generally the layer where the flexible screen is located or slightly lower or higher than the layer.

The hinge is also provided with a first guide structure which revolves together with the first support frame 21 around the hinge shaft 11 and a second guide structure which revolves together with the second support frame 22 around the hinge shaft 12; the first guide structure can be a guide groove 51, which is arranged on the first support frame 21, and the second guide structure can be a guide groove 52, which is arranged on the second support frame 22. The auxiliary supports 41 and 42 between the first support plate 31 and the main support 1 have a structure cooperating with the first guide structure for guiding, which can be a guide pin cooperating with the guide groove 51, and are labeled 411 and 421 respectively, and the auxiliary supports 43 and 44 between the second support plate 32 and the main support 1 have a structure The auxiliary supports 41 and 42 between the first support plate 31 and the main support 1 have a structure cooperating with the second guide structure for guiding, which can be a guide pin cooperating with the guide groove 52, and are labeled 431 and 441 respectively.

The above-mentioned cooperation for guiding further defines the height of the auxiliary supports in the height direction of the hinge (i.e. the thickness direction of the mobile terminal), which helps to make the support height of the bending portion of the hinge, the first support plate 31 and the second support plate 32 to the flexible screen to be consistent, so that the actual support of the hinge bending portion conforms to the support reference plane of the flexible screen as much as possible, and at the same time, the guide grooves 51 and 52 also play a limiting role on the end faces of the auxiliary supports 41, 42, 43 and 44, that is, limiting the auxiliary supports in the longitudinal direction of the hinge.

When there are multiple auxiliary supports between the first support plate 31 and the main support 1 and between the second support plate 32 and the main support 1, the above-mentioned cooperation for guiding can also make the multiple auxiliary supports between the first support plate and the main support and the multiple auxiliary supports between the second support plate and the main support rotate in order; there are other options for this rotation order, which can be changed by adjusting the guide groove, and the purpose of which is to make the auxiliary supports rotate in order, which can facilitate the smooth processing of the auxiliary support by the plastic sheet 700.

The first guide structure is provided with a position limiting structure for the structure which cooperates with the first guide structure for guiding, so that when the hinge is in the folded state, the relative position of the first guide structure and the structure that cooperates with the first guide structure for guiding is stable; the second guide structure is provided with a position limiting structure for the structure which cooperates with the second guide structure for guiding, so that when the hinge is in the folded state, the relative position of the second guide structure and the structure that cooperates with the second guide structure for guiding is stable. These position limiting structures are grooves 53 and 54 on the groove wall respectively, which cooperates with the guide pins.

The hinge is also provided with a synchronous control mechanism for making the first support and the second support revolve synchronously around the hinge shafts as the axes. The synchronous control mechanism comprises a first swing arm 61 and a second swing arm 62, which the first swing arm 61 are rotatably connected with the first shaft 11, and the second swing arm 62 are rotatably connected with the second shaft 12. Also, the first swing arm 61 and the second swing arm 62 are rotatably connected with one end of the first connecting rod 63 and the second connecting rod 64 respectively, and the rotation axes of the first connecting rod 63 and the second connecting rod 64 are perpendicular to the hinge rotation axis. The other ends of the first connecting rod 63 and the second connecting rod 64 are rotatably connected with the first support plate 31 and the second support plate 32, respectively.

The synchronous control mechanism is located at the inner side of the support reference plane of the flexible screen and is not on the same plane as the support reference plane of the flexible screen.

The inner side of the first support plate 31 and the inner side of the second support plate 32 are also connected with first covers 331 and 341, and the inner side of the first support frame 21 and the inner side of the second support frame 22 are also connected with second covers 332 and 342; the first cover 331 and the second cover 332 are overlapped, and the first cover 341 and the second cover 342 are overlapped, both of which are used to shield the above hinge structure.

As shown in the figure, the two hinges synthesize the hinge device of the mobile terminal, each of the two hinges includes the first support frame 21, the second support frame 22, the first hinge shaft 11, the second hinge shaft 12, the first support plate 31, the second support plate, the main support 1, the auxiliary supports 41, 42, 43 and 44, and the axes of the shafts 11 and 12 of the two hinges are one-to-one coincident; the first support plate 31 of the two hinges can be integrated, as well as the second support plate 32 of the two hinges, and the main support 1 of the two hinges; the number of the auxiliary supports between the first support plate 31 of the two hinges and the main support 1 is equal and the auxiliary supports are one-to-one connected as a whole; the number of the auxiliary supports between the second support plate 32 of the two hinges and the main support 1 is equal and the auxiliary supports are one-to-one connected as a whole.

A torsion mechanism can also be provided on the hinge shaft to provide rotation resistance by providing friction and achieve the function of stopping and positioning at any time. Any portion in the figure that is rotatably or slidably connected with the hinge shaft can be provided with the above torsion mechanism.

The mobile terminal having a flexible screen provided by the invention can be a mobile phone, a laptop, etc., which can be folded in book form. The mobile terminal having a flexible screen is provided with the hinge device and the flexible screen 100 which is arranged on the outside of the mobile terminal having a flexible screen, and the first support plate, the second support plate, the main support and the auxiliary supports constitute the support for the flexible screen.

The above is only a specific embodiment of the invention, but the structural features of the invention are not limited to this. Any change or modification made by those skilled in the art in the field of the invention is covered in the protection scope of the invention.

The invention claimed is:

1. A hinge of a mobile terminal having an external flexible screen, comprising a main support including a first hinge shaft and a second hinge shaft, and the hinge includes a first support frame and a second support frame which are respectively connected with the first hinge shaft and the second hinge shaft, and a first support and a second support which are respectively slidably connected with the first support frame and the second support frame; auxiliary supports are provided between the first support and the main support, and between the second support and the main support, and the main support and the auxiliary supports are located at a bending portion when the hinge is folded;

the hinge comprising a plastic sheet repeatedly bent back and forth; the plastic sheet is located on an end of the auxiliary supports and an end of the main support, and two ends of the plastic sheet are respectively connected with the first support and the second support, and the plastic sheet is also fixedly connected with the auxiliary supports and the main support.

2. The hinge of a mobile terminal having an external flexible screen according to claim 1, wherein the first support and the second support are respectively provided with a connector, and the plastic sheet is integrated with the connector on the first support and the connector on the second support by injection molding, hot melt connection, snap-fit connection or glue bonding.

3. The hinge of a mobile terminal having an external flexible screen according to claim 2, wherein the connector on the first support, the connector on the second support, the plastic sheet, the main support and the auxiliary supports are combined into an assembled unit module, and the connector on the first support and the connector on the second support are respectively connected with the first support and the second support.

4. The hinge of a mobile terminal having an external flexible screen according to claim 1, wherein the plastic sheet is integrated with the connector on the first support and the connector on the second support by hot melt connection or glue bonding.

5. The hinge of a mobile terminal having an external flexible screen according to claim 4, wherein the plastic sheet is also snap-fitted to the auxiliary supports and the main support.

6. The hinge of a mobile terminal having an external flexible screen according to claim 1, wherein the plastic sheet is snap-fitted to the auxiliary supports and the main support.

7. The hinge of a mobile terminal having an external flexible screen according to claim 1, wherein the plastic sheet is integrated with the auxiliary supports by injection molding.

8. The hinge of a mobile terminal having an external flexible screen according to claim 1, wherein the plastic sheet has concave portions recessed on a surface of a plastic sheet body between the corresponding adjacent auxiliary supports, and between the main support and the adjacent auxiliary supports, and the bottom of the concave portion is curved; the plastic sheet includes a corner portion and/or an insertion portion connected with the auxiliary supports, and inserting portion inserted into the main support which has corresponding holes, and a clamping column embedded in the first support plate and the second support plate.

9. The hinge of a mobile terminal having an external flexible screen according to claim 1, wherein the hinge is also provided with a first guide structure which revolves together with the first support frame around the first hinge shaft and a second guide structure which revolves together with the second support frame around the second hinge shaft; the auxiliary supports between the first support and the main support has a structure which cooperates with the first guide structure for guiding, and the auxiliary supports between the second support and the main support has a structure which cooperates with the second guide structure for guiding; the auxiliary supports between the first support and the main support can rotate, and revolve with the first support frame around the first hinge shaft, and the auxiliary supports body between the second support and the main support can rotate, and revolve with the second support frame around the second hinge shaft; the axes of rotation and the first and the second hinge shafts are parallel, and the center of the rotation is at or near the support reference plane of the flexible screen;

the hinge is also provided with a synchronous control mechanism for making the first support and the second support revolve synchronously around the first and the second hinge shafts as the axes.

10. A hinge device of a mobile terminal having an external flexible screen, comprising the two hinges according to claim 1, each of the two hinges includes the first support frame, the second support frame, the first hinge shaft, the second hinge shaft, the first support plate, the second support plate, the main support, the auxiliary supports; the axes of the first and the second hinge shafts of the two hinges are one-to-one coincident; the first support of the two hinges can be integrated, as well as the second support of the two hinges, and the main support of the two hinges; the number of the auxiliary supports between the first support of the two hinges and the main support is equal and the auxiliary supports are one-to-one connected as a whole; the number of the auxiliary supports between the second support of the two hinges and the main support is equal and the auxiliary supports are one-to-one connected as a whole.

* * * * *